(12) United States Patent
Igarashi et al.

(10) Patent No.: US 6,706,964 B2
(45) Date of Patent: Mar. 16, 2004

(54) ELECTRONIC DEVICE AND METHOD FOR MANUFACTURING THE SAME, AND METHOD FOR SHIELDING PRINTED CIRCUIT BOARD

(75) Inventors: Yutaka Igarashi, Hachioji (JP); Tadao Kishimoto, Hachioji (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 10/227,037

(22) Filed: Aug. 23, 2002

(65) Prior Publication Data

US 2003/0043563 A1 Mar. 6, 2003

(30) Foreign Application Priority Data

Sep. 4, 2001 (JP) ........................................ 2001-266948

(51) Int. Cl.⁷ ................................................. H05K 9/00
(52) U.S. Cl. ...................... 174/35 R; 174/250; 361/816
(58) Field of Search ...................... 174/35 R, 35 MS, 174/250, 255, 260; 361/763, 765, 799, 800, 816, 818

(56) References Cited

U.S. PATENT DOCUMENTS

| | | | | |
|---|---|---|---|---|
| 3,756,399 A | * | 9/1973 | Cosier et al. | 206/497 |
| 5,270,493 A | * | 12/1993 | Inoue et al. | 174/253 |
| 5,394,304 A | * | 2/1995 | Jones | 361/765 |
| 5,436,803 A | * | 7/1995 | Annis et al. | 361/818 |
| 5,597,979 A | * | 1/1997 | Courtney et al. | 174/35 R |
| 6,140,575 A | * | 10/2000 | Gunten et al. | 174/35 R |

OTHER PUBLICATIONS

English Statement of Japanese Patent Publication No. Tokuhyo–hei 5–500136.

* cited by examiner

Primary Examiner—Dean A. Reichard
Assistant Examiner—Carmelo Oliva
(74) Attorney, Agent, or Firm—Squire, Sanders & Dempsey

(57) ABSTRACT

An electronic device having a printed circuit board having a ground, an electrically insulating layer provided on a face of the printed circuit board, and an electromagnetic shielding layer adhered to the face of the printed circuit board through the electrically insulating layer. The ground of the printed circuit board and the electromagnetic shielding layer are conducted electrically.

21 Claims, 5 Drawing Sheets

COMPARISON OF SHIELDING EFFECT
(SIMULATION)

ELECTRONIC DEVICE AND METHOD FOR MANUFACTURING THE SAME, AND METHOD FOR SHIELDING PRINTED CIRCUIT BOARD

BACKGROUND OF THE INVENTION

1. Field of the Invention

The present invention relates to an electronic device mounted with a printed circuit board, and a method for manufacturing the same. Moreover, the present invention relates to a method for shielding the printed circuit board in order to reduce electromagnetic noises radiated from the printed circuit board.

2. Description of Related Art

In earlier technology, in an electronic device mounted with a printed circuit board, as shown in FIG. 7A, a shielding plate 30 is disposed in only one face side of a printed circuit board 10, or as shown in FIG. 7B, a printed circuit board 20 is installed into a box-like shielding member 40 and all the six faces of the printed circuit board 20 are shielded. The shielding plate 30 and the shielding member 40 corresponding to the printed circuit boards 10 and 20, respectively, are used in order to prevent electromagnetic wave from radiating from the wiring patterns (not shown) in the printed circuit boards 10 and 20. The shielding plate 30 and the shielding member 40 are away from the printed circuit boards 10 and 20 for a predetermined distance, respectively.

Accordingly, air exists between the shielding plate 30 and the printed circuit board 10 or the shielding member 40 and the printed circuit board 20, so that each dielectric constant is low, and the high frequency loss is small. Further, their structures are for shutting out the noises generated in the inside of the printed circuit boards 10 and 20 and the noises radiated from the outside of the boards 10 and 20. It was not particularly necessary to connect the printed circuit boards 10 and 20 to grounds.

Such shielding structures have shielding effects to the noises radiated from the printed circuit boards 10 and 20 themselves, that is, the noises radiated from the printed circuit boards 10 and 20 toward the shielding plate 30 and the shielding member 40, respectively. However, generally, in a printed circuit board, there is a cable for connecting to the outside. Thereby, even though the printed circuit board is shielded, if this cable is connected to the outside of the shield, noises (there are two noises, a common mode noise such that the noises of the power supply and that of the ground are common mode, and a differential mode noise such that those noises appear in differential mode) appear in the power supply and the ground (GND) itself of the printed circuit board, and this cable will operate as an antenna and will generate a big noise. That is, with the structure of such a shielding plate or a shielding member in earlier technology, the effect of suppressing the high frequency noise generated in the ground plane of a printed circuit board cannot be expected. Therefore, there were few effects of reducing a noise to the printed circuit board connected with a cable.

Further, since the distance between the wiring patterns of the printed circuit boards 10 and 20 and the shielding plate 30 and the shielding member 40, respectively, is large, particularly in the case of a double-sided board, the effect of the shielding plate 30 or the shielding member 40 as a return path of signals which flow the wiring patterns of the printed circuit boards 10 and 20 cannot be expected, either. Therefore, reinforcement of the ground plane of the printed circuit board is required for the countermeasure against noise. However, in order to reinforce the ground plane of a printed circuit board having a high mounting density of the parts, it is necessary to use quite a high multi-layer printed circuit board. Further, it is necessary to connect between the power supply and the GND by disposing many decoupling capacitors having good characteristic in order to reduce the noise between the power supply and the GND. Here, in the specification, the ground may be indicated as GND, as mentioned above.

As a solution for such a problem, as disclosed in the Japanese Patent Laid-Open Publication No. 5-500136 (Applicant, Xeikon corporation), a technology such that the noise generated between the power supply and the GND is absorbed by the printed circuit board itself and reduced by forming a thin layer having a high dielectric constant between the power supply layer and the GND layer of a multi-layer printed circuit board is suggested. However, it is required to use a special material, so that it has not been used widely in general in respect of cost or availability.

SUMMARY OF THE INVENTION

An object of the present invention is to suppress a common mode noise or a differential mode noise generated between a ground layer (GND layer) and a power supply layer.

Further, another object of the present invention is to reduce a noise generated from a printed circuit board without making the printed circuit board high multi-layered so much.

In order to achieve the above-described objects, according to a first aspect of the present invention, the electronic device comprises: a printed circuit board having a ground; an electrically insulating layer provided on a face of the printed circuit board; and an electromagnetic shielding layer adhered to the face of the printed circuit board through the electrically insulating layer. The ground of the printed circuit board and the electromagnetic shielding layer are conducted electrically.

The "printed circuit board" is a general term of a board for mounting electronic circuit parts thereon, including a printed wiring board, a flexible printed circuit board and the like. Further, the "electronic device" is an electronic device mounted with a printed circuit board, such as a copying machine, a printer, a personal computer, a measuring device and the like.

Further, in this electronic device, the electrically insulating layer may be a resin layer, and the electromagnetic shielding layer may be formed by applying an electroconductive paste on the resin layer. Then, a coat may be provided on the electromagnetic shielding layer formed with the electroconductive paste.

Moreover, the electromagnetic shielding layer is a layer having electroconductivity. It may be plate-like, and furthermore, it may be a metal member. Here, the "metal member" includes a metal frame, a metal plate, a metal panel and the like of the electronic device mounted with the printed circuit board.

Preferably, the electromagnetic shielding layer covers an end face of the printed circuit board.

Further, the printed circuit board may be a multi-layer printed circuit board in which a power supply layer is disposed in an external layer of the electromagnetic shielding layer side.

Moreover, the electromagnetic shielding layer may be a bag-like member, and the electrically insulating layer may be provided on an inner face of the bag-like member.

Preferably, the electrically insulating layer is sheet-like, and more preferably, a dielectric constant of the electrically insulating layer is not less than 5. Further, the electrically insulating layer may be provided previously on the printed circuit board, or may be provided separately on the printed circuit board.

According to a second aspect of the present invention, the method for manufacturing an electronic device, comprises: providing an electrically insulating layer on a face of a printed circuit board having a ground; providing an electromagnetic shielding layer so as to adhere to the face of the printed circuit board through the electrically insulating layer; and conducting the ground of the printed circuit board and the electromagnetic shielding layer electrically.

Further, in the method for manufacturing the electronic device, the providing the electrically insulating layer may comprise applying an electrically insulating resin layer, and the providing the electromagnetic shielding layer may comprise applying an electroconductive paste on the resin layer.

Preferably, the method further comprises providing a coat on the electromagnetic shielding layer provided with the electroconductive paste.

According to a third aspect of the present invention, the method for manufacturing an electronic device, comprises: inserting a printed circuit board into a bag-like electromagnetic shielding member, an electrically insulating layer being provided on an inner face of the electromagnetic shielding member; and adhering the electromagnetic shielding member to a face of the printed circuit board through the electrically insulating layer by extracting air in the bag-like electromagnetic shielding member in which the printed circuit board is inserted.

According to a fourth aspect of the present invention, the method for shielding a printed circuit board, comprises: providing an electrically insulating layer on a face of the printed circuit board having a ground; providing an electromagnetic shielding layer so as to adhere to the face of the printed circuit board through the electrically insulating layer; and conducting the ground of the printed circuit board and the electromagnetic shielding layer electrically.

According to a fifth aspect of the present invention, the method for shielding a printed circuit board, comprises: inserting a printed circuit board into a baglike electromagnetic shielding member, an electrically insulating layer being provided on an inner face of the electromagnetic shielding member; and adhering the electromagnetic shielding member to a face of the printed circuit board through the electrically insulating layer by extracting air in the bag-like electromagnetic shielding member in which the printed circuit board is inserted.

According to the electronic device and the method for shielding the printed circuit board of the present invention, since the ground of the printed circuit board and the electromagnetic shielding layer or the electromagnetic shielding member are electrically conducted, the electromagnetic shielding layer or member functions not only as a shield for shielding an electromagnetic noise radiated from the printed circuit board but also as a ground layer. That is, the same effect as increasing one ground layer can be obtained. Therefore, a return path of signals from the wiring patterns of the printed circuit board can be obtained stably. Thus, the ground can be reinforced without making the printed circuit board high multi-layered.

Further, since the electrically insulating layer is sandwiched in between the printed circuit board and the electromagnetic shielding layer or member which functions as a ground layer, the capacity of the capacitor formed between the signal layer of the printed circuit board and the ground layer, between the power supply layer and the ground layer, or the like, becomes large. Thereby, the characteristic impedance of the printed circuit board lowers, and noises are absorbed by the whole printed circuit board. In particular, the noises (common mode noise and differential mode noise) generated between the power supply layer and the ground layer can be reduced well. Moreover, the capacity of the above-described capacitor can be made large, and the above-described return path can also be made short by adhering the electromagnetic shielding layer or member to at least one face of the printed circuit board through the electrically insulating layer. Therefore, noises can be further reduced.

Thus, noises, particularly the noises generated between the power supply layer and the ground layer can be reduced well without making the printed circuit board high multi-layered.

Further, according to the method for manufacturing the electronic device of the present invention, an electronic device by which the above-described effects are obtained can be manufactured.

BRIEF DESCRIPTION OF THE DRAWINGS

The present invention will become more fully understood from the detailed description given hereinbelow and the appended drawings which given by way of illustration only, and thus are not intended as a definition of the limits of the present invention, and wherein.

PREFERRED EMBODIMENT OF THE INVENTION

Hereinafter, a first embodiment of the present invention will be explained with reference to FIG. 1.

Figure 1:
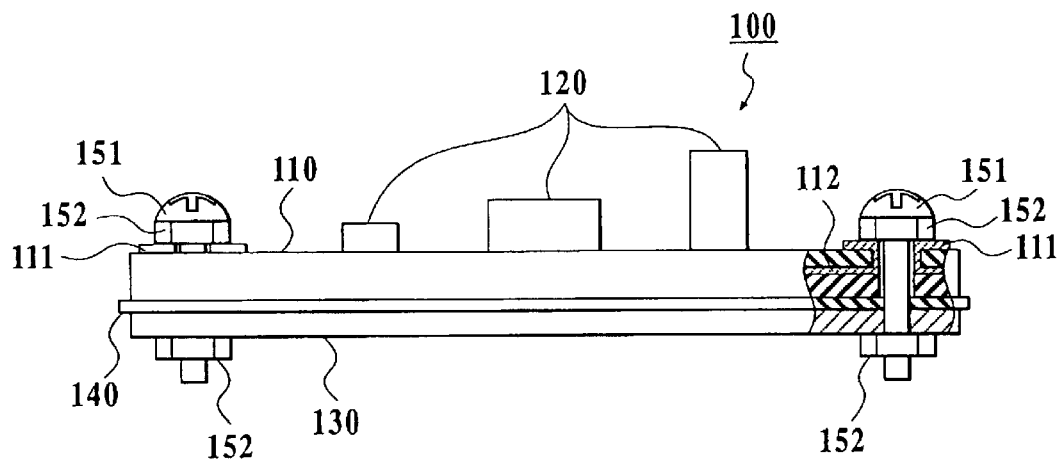
FIG. 1 is a fragmentary sectional view showing a principal portion of an electronic device of a first embodiment of the present invention.

In an electronic device 100 of the embodiment, as shown in FIG. 1, a shielding plate (electromagnetic shielding layer) 130 is adhered to a printed circuit board 110 through a thin insulating sheet (electrically insulating layer) 140. Moreover, in order to conduct electrically a ground pattern (ground) 111 of the printed circuit board 110 to the shielding plate 130 certainly, a resist in a portion of the ground pattern 111 is completely removed. The ground pattern 111 and the shielding plate 130 are tightened with bolts 151 and nuts 152, which are metal screws, so that they are electrically conducted completely. Therefore, the shielding plate 130 functions as a return path of signals which flow the wiring patterns (not shown) of the printed circuit board 110. Thereby, the same effect as increasing one layer of a ground layer of the printed circuit board 110 can be obtained. In addition, the reference numeral 112 in FIG. 1 indicates a ground plane of the printed circuit board 110, and the reference numeral 120 indicates the mounted parts.

As a shielding plate, for example, a steel plate, an aluminum plate or the like may be used. Its size is preferable to be larger than the printed circuit board. Further, a clamp, a calking or a rivet having a metal body, soldering or the like can be applied to the contact structure other than the contact structure through the above-described bolts and nuts, which are metal screws. Moreover, the thickness of the insulating sheet is preferably not more than 0.2 mm.

According to the above-described structure in the electronic device 100, a high-frequency noise generated in the ground plane 112 can be suppressed. That is, since the shielding plate 130 is adhered to the printed circuit board 110 through the insulating sheet 140, the distance between the shielding plate 130 and the wiring patterns (not shown) of the printed circuit board 110 can be made extremely small. Thereby, an effect of the shielding plate 130 as a return path of signals which flow the wiring patterns of the printed circuit board 110 becomes good. In general, in a printed circuit board having high mounting density, many via-holes (through-holes) are provided, that is, many holes are provided in a ground plane. Therefore, the return path of the signals becomes long, so that a high multi-layer printed circuit board must be used in order to reinforce the ground plane. However, in the embodiment, as mentioned above, the ground plane 112 can be reinforced without being influenced by the number of via-holes (through-holes) by obtaining the return path stably, even though the printed circuit board 110 has high mounting density of the parts 120. Therefore, the countermeasure against noise can be realized even though a high multi-layer printed circuit board is not used.

Figure 2:
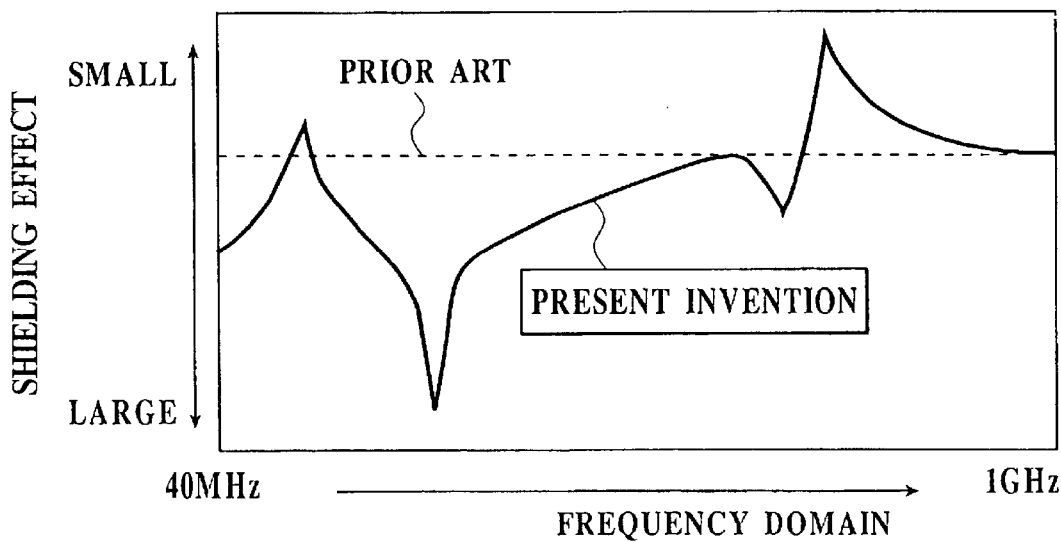
FIG. 2 is a graph showing a comparison in shielding effects of a shielding plate in the electronic device of the present invention and a shielding plate in an electronic device in earlier technology.
Figure 7A:
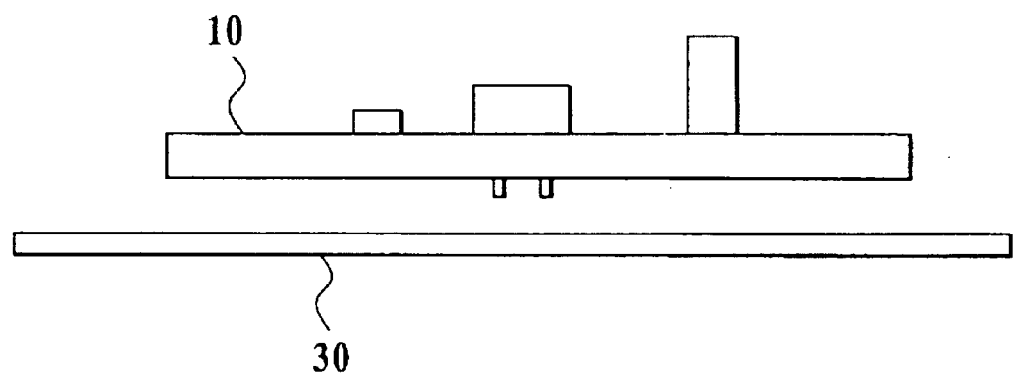
FIG. 7A is a schematic view showing a portion of an electronic device in earlier technology.
Figure 7B:
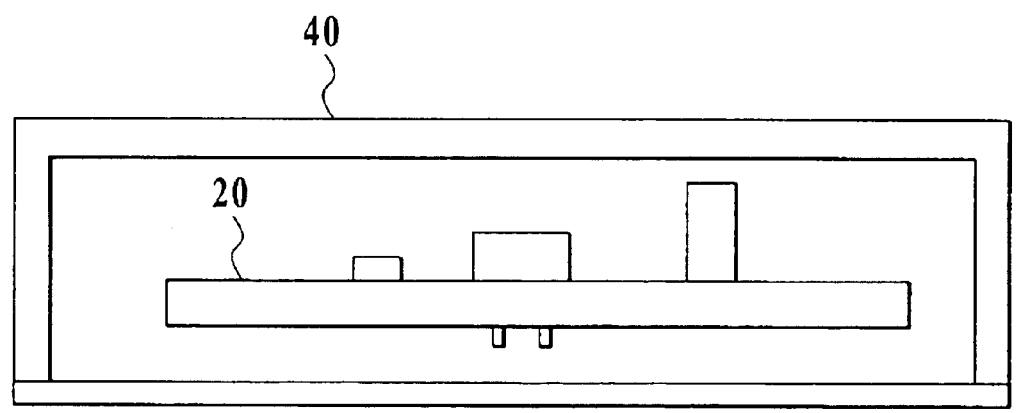
FIG. 7B is a schematic view showing a portion of another electronic device in earlier technology.

The shielding effect of the shielding plate 130 shown in FIG. 1 was simulated for every frequency, and the result is shown in FIG. 2 with the result obtained from the shielding plate 30 and the shielding member 40 in the earlier technology shown in FIGS. 7A and 7B. In FIG. 2, in comparison with the shielding effect in the earlier technology, the shielding effect of the shielding plate 130 in the electronic device of the present invention has become extremely large in the region between 200 and 300 MHz that is a frequency region which tends to be a problem in general apparatuses.

Between the interlayer distance d of the capacitor having a predetermined area S, which is formed between a signal layer and the ground layer (GND layer), between the power supply layer and the ground layer (GND layer), or the like, and the capacity C of the capacitor, there exists a relational expression of $C = k\epsilon S/d$ (k: proportional constant). Here, $\epsilon$ is dielectric constant. That is, the capacity C of the above-described capacitor is in inverse proportion to the interlayer distance d and in proportion to the dielectric constant $\epsilon$. Therefore, in case that the thin insulating sheet 140 having a large dielectric constant is sandwiched in between the shielding plate 130 and the printed circuit board 110, the above-described capacity C becomes extremely large. Thereby, the frequency characteristic of the printed circuit board 110 becomes capacitive, and the characteristic impedance lowers greatly. Even though a noise is generated, it is absorbed in the region between 200 and 300 MHz and is hardly radiated into space. Therefore, an effect that the noise is greatly reduced can be obtained.

In the embodiment, the result shown in FIG. 2 was obtained by using the one whose dielectric constant $\epsilon$ is 5. Although an almost good effect can be obtained only by using the thin insulating sheet 140, such as PET, epoxy resin or the like, without concerning the dielectric constant $\epsilon$, it is preferable to use a material having a dielectric constant $\epsilon$ not less than 5 since the effect becomes extremely good. As a material having a dielectric constant $\epsilon$ not less than 5, there is, for example, a glass epoxy ($\epsilon \cong 5.0$), a vinylidene fluoride ($\epsilon = 7.0$) or the like.

Next, a second embodiment of the present invention will be explained with reference to FIG. 3.

Figure 3:
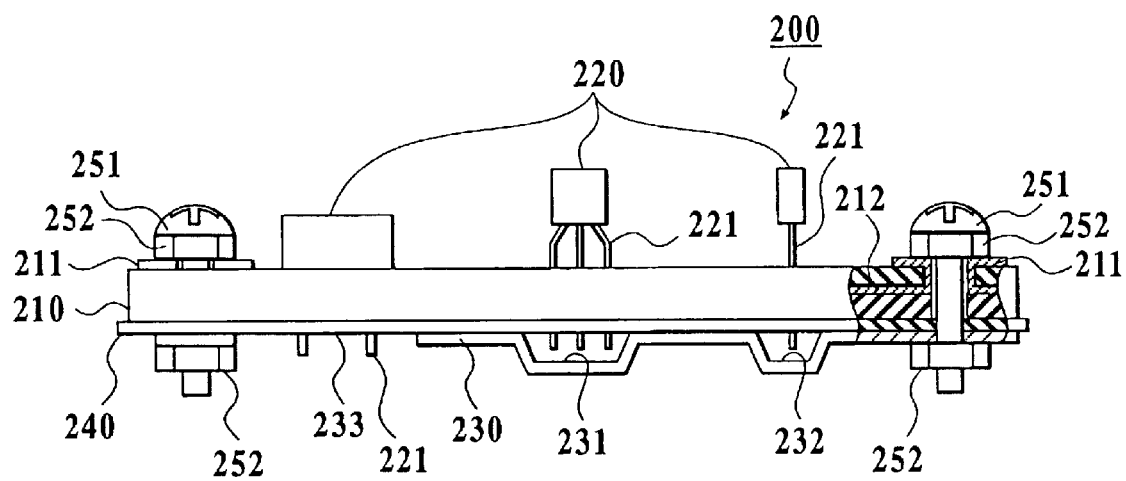
FIG. 3 is a fragmentary sectional view showing a principal portion of an electronic device of a second embodiment of the present invention.

In an electronic device 200 of the embodiment, as shown in FIG. 3, a shielding plate 230 provided with hollows 231 and 232 and a hole 233 is adhered to a printed circuit board 210 through an insulating sheet 240. The reason for providing the hollows 231 and 232 and the hole 233 is because unlike the case shown in FIG. 1, leads 221 of mounted electronic parts 220 may pass through the printed circuit board 210 or the insulating sheet 240 and may hit a shielding plate, when inserting the mounted electronic parts 220 in the printed circuit board 210. Thereby, the leads 221 provided on the electronic parts 220 for being mounted on the printed circuit board 210 will not be broken by hitting the shielding plate 230 even though the leads 221 pass through the printed circuit board 210 or the insulating sheet 240. Further, in the embodiment, since a ground pattern 211 of the printed circuit board 210 and the shielding plate 230 are electrically conducted through bolts 251 and nuts 252, which are metal screws, the same effect as the above-described first embodiment can also be obtained. In addition, the reference numeral 212 indicates a ground plane of the printed circuit board 210.

Further, the shielding plate 230 can be used in combination with a metal frame of the device to which the printed circuit board is attached. Moreover, a clamp, a calking or a rivet having a metal body, soldering or the like can be applied to the contact structure other than the contact structure through the above-described bolts and nuts, which are metal screws.

Next, a third embodiment of the present invention will be explained with reference to FIG. 4.

Figure 4:
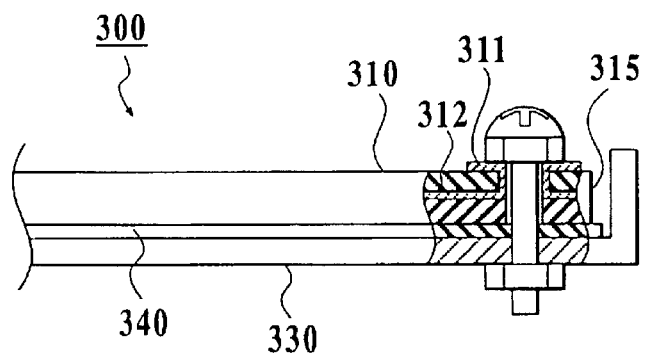
FIG. 4 is a fragmentary sectional view showing a principal portion of an electronic device of a third embodiment of the present invention.

In an electronic device 300 of the embodiment, as shown in FIG. 4, a shielding plate 330 adhered to a printed circuit board 310 through an insulating sheet 340 has a shape of covering an end face 315 of the printed circuit board 310. Further, in the embodiment, a ground pattern 311 of the printed circuit board 310 and the shielding plate 330 are also electrically conducted through bolts 351 and nuts 352, which are metal screws. Thereby, the same effect as the above-described first and second embodiments can be obtained. Moreover, the electromagnetic noise can be prevented from radiating from the end face 315 of the printed circuit board 310. In particular, it has a great effect in preventing the radiation of the electromagnetic noise in a multi-layer printed circuit board. In addition, the reference numeral 312 in FIG. 4 indicates a ground plane of the printed circuit board 310.

Further, in the embodiment, the shielding plate 330 in FIG. 4 may be contacted with the end face 315 of the printed circuit board 310.

Figure 5:
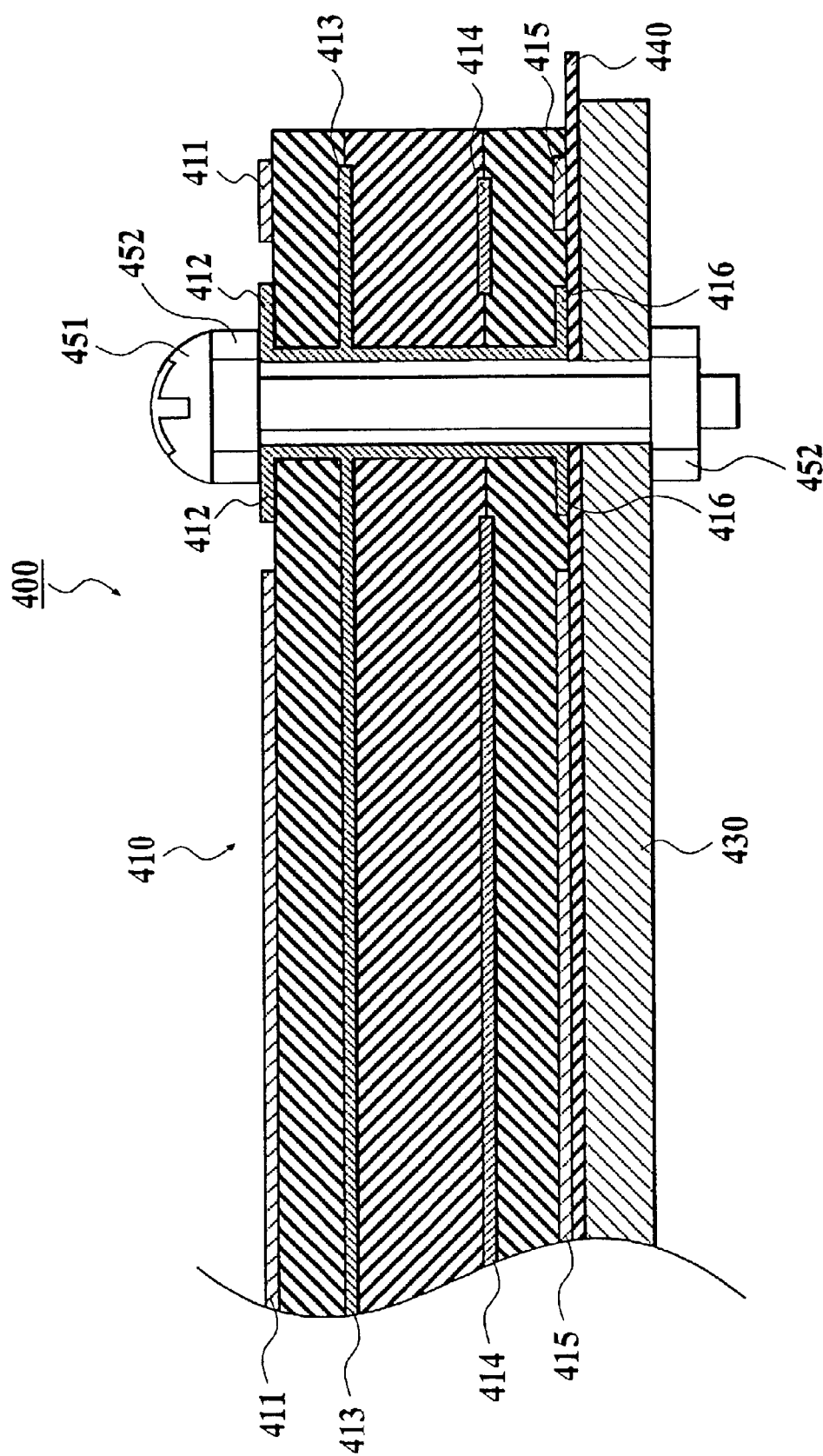
FIG. 5 is a fragmentary sectional view showing a principal portion of an electronic device of a fourth embodiment of the present invention.

Next, a fourth embodiment of the present invention will be explained with reference to FIG. 5.

In an electronic device 400 of the embodiment, a shielding plate 430 is adhered to a printed circuit board 410 through an insulating sheet 440. In the printed circuit board 410, the signal layer and the power supply layer of a four-layer printed circuit board which is generally used are replaced with each other. That is, as shown in FIG. 5, a power supply layer 415 is provided in the external layer (the lowest layer in FIG. 5) of the shielding plate 430 side of the printed circuit board 410. The power supply layer 415 and the shielding plate 430 which functions as a ground layer (GND layer) are extremely approached by sandwiching the insulating sheet 440 in between them. Thereby, a common mode noise of several hundreds mV appeared in the ground or the power supply layer 415 is reduced. Here, the reference numerals 411 and 414 in FIG. 5 indicate signal layers, and the reference numeral 413 indicates a ground layer. Then, the ground pattern 412 and the shielding plate 430 are electrically conducted through bolts 451 and nuts 452, which are metal screws. Thereby, almost the same effect as the above-described first to third embodiments can be obtained. In addition, the reference numeral 416 indicates a ground pattern.

The reason why the power supply layer (power supply plane) 415 is disposed in the external layer of the shielding plate 430 side of the printed circuit board 410 will be explained in the following.

When a signal layer is in the external layer, that is, when the signal layer in the external layer is sandwiched in between the power supply layer and the shielding layer (shielding plate) with the insulating sheet, the characteristic impedance of the signal line of the signal layer sandwiched in between the power supply layer and the shielding layer decreases greatly. Therefore, the characteristic of the printed circuit board itself will differ greatly from the characteristic of the above-described printed circuit board to which the shielding plate is attached, so that there might be a case that the printed circuit board cannot be operated when the shielding plate is attached thereto. Accordingly, it is necessary to dispose the power supply layer in the external layer so as to stabilize the characteristic impedance of the printed circuit board.

Further, as a solution for the above-described problem, there is a method for forming an electrically conducting layer by applying a resin (resin layer), such as, a silicone resin, an acryl resin or the like, instead of the insulating sheet, and by applying an electroconductive paste on the resin. Thereby, the characteristic impedance can be stabilized. However, in this case, even though the impedance is stabilized by forming the electrically conducting layer, it becomes impossible to balance with the impedance in the component side, and problems, such as reflection or the like, will arise. Therefore, even though it is the case that the electrically conducting layer is formed with the electroconductive paste, as mentioned-above, it is necessary to replace the power supply layer with the signal layer and bring the power supply layer in the external layer in order to solve the problems, such as reflection or the like. Here, a coat may be further provided on the above-described electroconductive paste. Thereby, the electroconductive paste may not need to be a solid completely.

In addition, although it is not shown in the figures, a metal frame, a metal panel (metal member) or the like, of a body of the device to which the printed circuit board is attached, may be used as the shielding plate. Then, the metal frame, the metal panel or the like may be adhered to the printed circuit board through an insulator having a high dielectric constant. Moreover, the ground pattern of the printed circuit board and the metal frame, the metal panel or the like may be electrically conducted.

Next, a fifth embodiment of the present invention will be explained with reference to FIG. 6.

Figure 6:
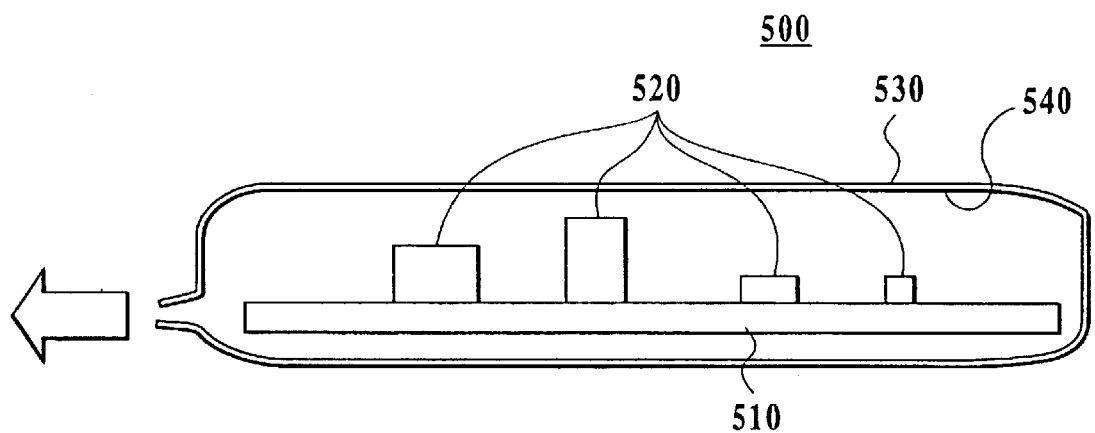
FIG. 6 is a schematic view showing a manufacturing process of an electronic device of a fifth embodiment of the present invention.

In an electronic device 500 of the embodiment, as shown in FIG. 6, an insulating material (electrically insulating layer) 540 is applied on an inner side of a bag-like member (bag-like electromagnetic shielding layer) 530 having a high electroconductivity, such as an aluminum or the like, and a printed circuit board 510 is put into it. Thereafter, air in the bag-like member 530 is extracted, so that the bag-like member 530 is adhered to the whole lower face of the printed circuit board 510 through the insulating material 540. FIG. 6 shows a state of the electronic device 500 before extracting the air. Thereby, almost the same effect as each above-described embodiment can be obtained. In addition, the reference numeral 520 indicates the mounted parts.

As mentioned above, the electronic devices 100 to 500 that are strong against the electromagnetic environment and suppress the interference from others and have a high electromagnetic compatibility for not radiating interference to other apparatus systems are obtained.

In the above, the embodiment of the present invention is explained. However, it is needless to say that the present invention is not limited to such embodiment, but various modifications are possible in a range within the scope of the present invention.

The entire disclosure of Japanese Patent Application No. 2001-266948 filed on Sep. 4, 2001, including specification, claims, drawings and summary are incorporated herein by reference in its entirety.

What is claimed is:

1. An electronic device comprising:
   a printed circuit board having a ground;
   an electrically insulating layer provided on a face of the printed circuit board; and
   an electromagnetic shielding layer which is plate-like and is adhered to the face of the printed circuit board through the electrically insulating layer so as to be detachable from the face of the printed circuit board;
   wherein the ground of the printed circuit board and the electromagnetic shielding layer are conducted electrically.

2. The device of claim 1, wherein the electrically insulating layer is a resin layer, and the electromagnetic shielding layer is formed by applying an electroconductive paste on the resin layer.

3. The device of claim 2, wherein a coat is provided on the electromagnetic shielding layer formed with the electroconductive paste.

4. The device of claim 1, wherein the electromagnetic shielding layer is a metal member.

5. The device of claim 1, wherein the electromagnetic shielding layer covers an end face of the printed circuit board.

6. The device of claim 1, wherein the printed circuit board is a multi-layer printed circuit board in which a power supply layer is disposed in an external layer of the electromagnetic shielding layer side.

7. The device of claim 1, wherein the electromagnetic shielding layer is a bag-like member, and the electrically insulating layer is provided on an inner face of the bag-like member.

8. The device of claim 1, wherein the electrically insulating layer is sheet-like.

9. The device of claim 1, wherein the ground of the printed circuit board and the electromagnetic shielding layer are tightened with a metal body so as to be electrically conducted through the metal body.

10. The device of claim 1, wherein at least one of a hollow and a hole is provided for the electromagnetic shielding layer.

11. The device of claim 1, wherein the electromagnetic shielding layer forms a part of at least one of a metal frame and a metal member for the device on which the printed circuit board is mounted.

12. A method for manufacturing an electronic device, comprising:

proviing an electrically insulating layer on a face of a printed circuit board having a ground;

providing an electromagnetic shielding layer which is plate-like, so as to adhere to the face of the printed circuit board through the electrically insulating layer to be detachable from the face of the printed circuit board; and conducting the ground of the printed circuit board and the electromagnetic shielding layer electrically.

13. The method of claim 12, wherein the providing the electrically insulating layer comprises applying an electrically insulating resin layer, and the providing the electromagnetic shielding layer comprises applying an electroconductive paste on the resin layer.

14. The method of claim 13, further comprising providing a coat on the electromagnetic shielding layer provided with the electroconductive paste.

15. The method of claim 12, wherein the conducting the ground of the printed circuit board and the electromagnetic shielding layer electrically includes tightening the ground of the printed circuit board and the electromagnetic shielding layer with a metal body so as to be electrically conducted through the metal body.

16. The method of claim 12, wherein at least one of a hollow and a hole is provided for the electromagnetic shielding layer.

17. The method of claim 12, wherein the providing an electromagneitc shielding layer includes providing a part of at least one of a metal frame and a metal member for the device on which the printed circuit board is mounted, as the electromagnetic shielding layer.

18. A method for shielding a printed circuit board, comprising:

providing an electrically insulating layer on a face of the printed circuit board having a ground;

providing an electromagnetic shielding layer which is plate-like, so as to adhere to the face of the printed circuit board through the electrically insulating layer to be detachable from the face of the printed circuit board; and conducting the ground of the printed circuit board and the electromagnetic shielding layer electrically.

19. The method of claim 18, wherein the conducting the ground of the printed circuit board and the electromagnetic shielding layer electrically includes tightening the ground of the printed circuit board and the electromagnetic shielding layer with a metal body so as to be electrically conducted through the metal body.

20. The method of claim 18, wherein at least one of a hollow and a hole is provided for the electromagnetic shielding layer.

21. The method of claim 18, wherein the providing an electromagnetic shielding layer includes providing a part of at least one of a metal frame and a metal member for the device on which the printed circuit board is mounted, as the electomagnetic shielding layer.

* * * * *